(12) United States Patent
Chang et al.

(10) Patent No.: US 12,165,888 B2
(45) Date of Patent: Dec. 10, 2024

(54) METHOD AND SYSTEM FOR BONDING

(71) Applicant: Taiwan Semiconductor Manufacturing Co., Ltd., Hsinchu (TW)

(72) Inventors: Chieh Chang, Hsinchu (TW); Jyh-Cherng Sheu, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 469 days.

(21) Appl. No.: 17/532,104

(22) Filed: Nov. 22, 2021

(65) Prior Publication Data

US 2022/0367215 A1 Nov. 17, 2022

Related U.S. Application Data

(60) Provisional application No. 63/187,551, filed on May 12, 2021.

(51) Int. Cl.
*H01L 21/67* (2006.01)
*H01L 21/66* (2006.01)
*H01L 21/683* (2006.01)

(52) U.S. Cl.
CPC .. *H01L 21/67092* (2013.01); *H01L 21/67288* (2013.01); *H01L 21/6838* (2013.01); *H01L 22/12* (2013.01)

(58) Field of Classification Search
CPC ......... H01L 21/67092; H01L 21/67288; H01L 21/6838; H01L 22/12
See application file for complete search history.

(56) References Cited

U.S. PATENT DOCUMENTS

| | | |
|---|---|---|
| 2013/0312907 A1 | 11/2013 | Oh et al. |
| 2014/0261960 A1 | 9/2014 | Lin et al. |
| 2014/0338813 A1 | 11/2014 | Ookawa |
| 2015/0210057 A1* | 7/2015 | Wagenleithner ...... H01L 21/187 |
| 2016/0155721 A1* | 6/2016 | Sugakawa ............. H01L 21/681 |
| | | 438/5 |
| 2018/0047699 A1* | 2/2018 | Omori ................. H01L 21/2007 |
| 2018/0158796 A1 | 6/2018 | Otsuka et al. |
| 2018/0370210 A1* | 12/2018 | Kim ....................... H01L 24/08 |

(Continued)

OTHER PUBLICATIONS

Jim Lucas, "What is Infrared?", Live Science, Feb. 27, 2019, 5 pages.

(Continued)

*Primary Examiner* — Yasser A Abdelaziez
(74) *Attorney, Agent, or Firm* — Slater Matsil, LLP

(57) ABSTRACT

A method of forming a semiconductor device includes mounting a first wafer on a first wafer chuck and mounting a second wafer on a second wafer chuck. A push pin is extended through the first wafer chuck to distort the first wafer. A surface profile distortion of the first wafer is measured with a first surface profiler. A vacuum pressure of a vacuum zone on the first wafer chuck is adjusted using a measurement of the surface profile distortion. The first wafer chuck is moved towards the second wafer chuck so that the first wafer physically contacts the second wafer, and the first wafer is bonded to the second wafer.

20 Claims, 16 Drawing Sheets

(56) References Cited

U.S. PATENT DOCUMENTS

| | | | |
|---|---|---|---|
| 2019/0096848 A1* | 3/2019 | Huang | H01L 24/94 |
| 2019/0228995 A1 | 7/2019 | Wimplinger et al. | |
| 2020/0055296 A1* | 2/2020 | Kim | H01L 21/67092 |
| 2020/0075533 A1 | 3/2020 | Gao et al. | |
| 2020/0294828 A1* | 9/2020 | Tsai | H01L 21/67288 |
| 2021/0057263 A1* | 2/2021 | Kim | H01L 21/68735 |
| 2021/0287926 A1 | 9/2021 | Eto | |
| 2022/0026196 A1* | 1/2022 | Zinner | H01L 24/80 |

OTHER PUBLICATIONS

E. N. Morel et al., "Spectral Low Coherence Interferometry: A Complete Analysis of the Detection System and the Signal Processing" ISBN: 978-51-0403-02, 2012, 26 pages.

\* cited by examiner

METHOD AND SYSTEM FOR BONDING

PRIORITY CLAIM AND CROSS-REFERENCE

This application claims the benefit of U.S. Provisional Application No. 63/187,551, filed on May 12, 2021, which application is hereby incorporated herein by reference.

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In fusion bonding, an oxide surface of a wafer is bonded to an oxide surface or a silicon surface of another wafer. In eutectic bonding, two eutectic materials are placed together, and a high pressure and a high temperature are applied. The eutectic materials are hence melted. When the melted eutectic materials solidify, the wafers bond together. In direct metal-to-metal bonding, two metal pads are pressed against each other at an elevated temperature, and the inter-diffusion of the metal pads causes the bonding of the metal pads. In hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
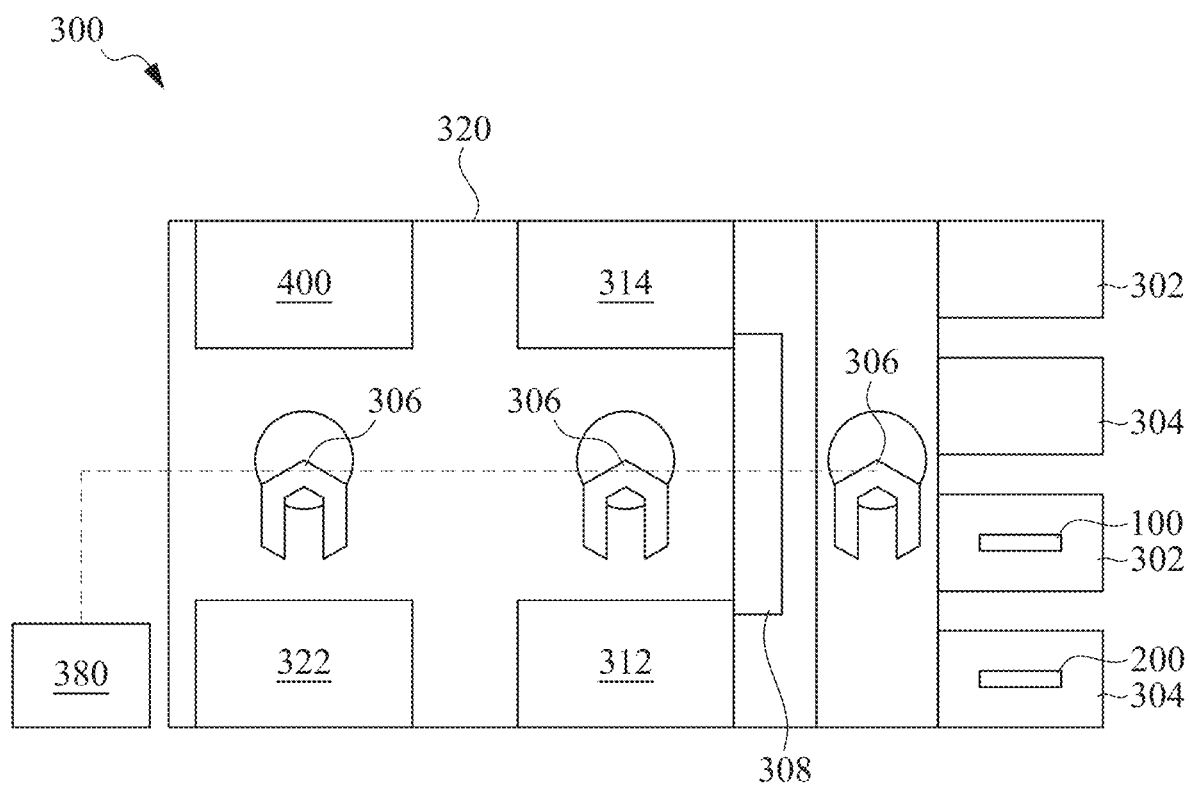
FIG. 1 illustrates a top-view of a bonding system in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a wafer bonding system is utilized. The wafer bonding system allows for the bonding of a first wafer to a second wafer while reducing surface profile distortion. Prior to initiating the bonding process, the surface profile distortion of the first wafer on a chuck is measured by an optical surface profiler such as a laser displacement sensor or interferometer. The surface profile distortion measurements are used to compensate for the surface profile distortion by adjusting vacuum pressures of vacuum zones on the chuck. Reducing the surface profile distortion of the first wafer can decrease local distortion of the bonded pair of the first and second wafers.

FIG. 1 shows a top view of a wafer bonding system 300 that may be used to bond a wafer 100 with a wafer 200. The process flow in accordance with the embodiments is briefly described below, and the details of the process flow and the wafer bonding system 300 are discussed, referencing FIGS. 2 through 10. In some embodiments, the wafer bonding system 300 can be used to bond the wafers 100 and 200 through semiconductor-on-insulator (SOI) bonding, fusion bonding (e.g., hydrophilic bonding or hydrophobic bonding), eutectic bonding, hybrid bonding, or the like. However, any suitable method of bonding may be utilized.

The wafers 100 and 200 may be semiconductor wafers, such as silicon wafers, or semiconductor substrates, such as bulk semiconductors, a semiconductor-on-insulator (SOI) substrate, or the like, which may be doped (e.g., with a p-type or an n-type dopant) or undoped. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the wafers 100 and 200 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. In some embodiments, the wafers 100 and 200 comprise silicon, silicon germanium, combinations of these, or the like, and outer surfaces of the wafers 100 and 200 to be bonded may have a Si—O—Si crystalline structure.

In some embodiments, the wafers 100 and 200 are package components comprising a device wafer, a package substrate, an interposer wafer, or the like. In the embodiments in which the wafer 100 comprises a device wafer, the wafer 100 may include a semiconductor substrate, which may be, for example, a silicon substrate, although other semiconductor substrates are also usable. Active devices may be formed on a surface of the substrate, and may include, for example, transistors. Metal lines and vias may be formed in dielectric layers over the substrate, which may be low-k dielectric layers in some embodiments. The low-k dielectric layers may have dielectric constants (k values) lower than, for example, about 3.5, lower than about 3.0, or lower than about 2.5. The dielectric layers may also comprise non-low-k dielectric materials with dielectric constants (k values) greater than 3.9. The metal lines and vias may comprise copper, aluminum, nickel, tungsten, or alloys thereof. The metal lines and vias interconnect the active devices, and may connect the active devices to overlying metal pads formed on the dielectric layers. In some embodiments, the wafer 100 is an interposer wafer, which is free from active devices therein. The wafer 100 may or may not include passive devices (not shown) such as resistors, capacitors, inductors, transformers, and the like in accordance with some embodiments. In some embodiments, the wafer 100 is a package substrate. In some embodiments, the wafer 100 includes laminate package substrates, wherein conductive traces are embedded in laminate dielectric layers. In some embodiments, the wafers 100 and 200 are build-up package substrates, which comprise cores and conductive traces built on the opposite sides of the cores.

In some embodiments, the wafer bonding system 300 comprises loading stations 302 and 304, transfer robots 306 to move wafers between areas of the wafer bonding system 300, a controller 380, and a bonding area 320 containing a pre-alignment module 312, a surface treatment station 314, a cleaning station 322, and a bonding station 400. However, more or fewer stations may be utilized within the wafer bonding system 300. In some embodiments, the controller 380 comprises a programmable computer. The controller 380 is illustrated as a single element for illustrative purposes. In some embodiments, the controller 380 comprises multiple elements. The controller 380 may be connected to the transfer robots 206 and may be configured to move the wafers 100 and 200 through the bonding process.

To start the bonding process, the wafers that are to be bonded (for example, wafers 100 and 200) are loaded into the wafer bonding system 300 through one or more of the loading stations 302 and 304. For example, in some embodiments loading stations 302 are front opening unified pods (FOUPs) used to load wafers 100 (e.g., bottom wafers) and loading stations 304 are FOUPs used to load wafers 200 (e.g., top wafers). However, any suitable methods and loading stations may be utilized.

A transfer robot 306 adjacent to both the loading stations 302 and the bonding area 320 receives the wafers 100 and 200 from the loading stations 302 and 304 and places them into a load-lock 308 for the bonding area 320. The bonding area 320 may be a vacuum environment (a vacuum chamber). Furthermore, the bonding area 320 may be surrounded by a chamber housing 315 (see below, FIG. 2) made of material that is inert to the various process materials. As such, while the bonding area 320 may be any suitable material that can withstand the chemistries and pressures involved in the treatment process, in an embodiment the bonding area 320 may be steel, stainless steel, nickel, aluminum, alloys of these, combinations of these, and the like.

The bonding area 320 may also be connected to one or more vacuum pumps 406 (see below, FIG. 2) for exhaust from the bonding area 320. In an embodiment the vacuum pump 406 is under the control of the controller 380, and may be utilized to control the pressure within the bonding area 320 to a desired pressure. Additionally, once the bonding process is completed, the vacuum pump 406 may be utilized to evacuate the bonding area 320 in preparation for removal of the wafers 100 and 200.

In the bonding area 320, the wafers 100 and 200 are transferred by a transfer robot 306 to a pre-alignment module 312. In an embodiment the pre-alignment module 312 may comprise one or more rotating arms which can rotate the wafers 100 and 200 to any desired rotational position using, e.g., a notch located within the wafers 100 and 200 (see below, FIG. 5C). However, any suitable angular position may be utilized.

Figure 2A:
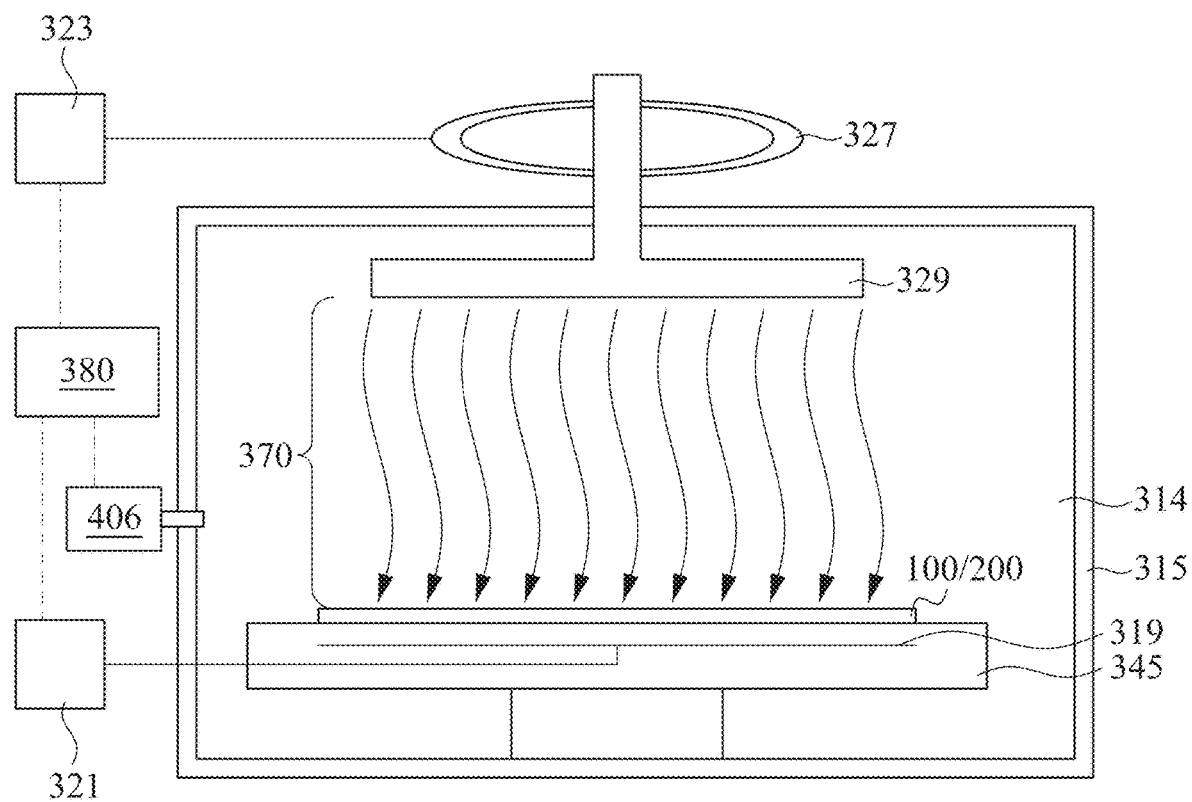
FIG. 2A illustrates a cross-sectional view of an intermediate step in a bonding process, in accordance with some embodiments.

Next, referring to FIG. 2A, a transfer robot 306 within the bonding area 320 transfers the wafers 100 and 200 from the pre-alignment module 312 to the surface treatment station 314. In some embodiments, the surface treatment station 314 is utilized to perform a surface treatment 370, or surface activation, on the surfaces of the wafers 100 and 200. In some embodiments, the surface treatment 370 includes a plasma activation step, a liquid activation step, combinations of these, or the like. However, any suitable surface treatment may be utilized.

Within the surface treatment station 314 is located a mounting platform 345 in order to position and control the wafers 100 and 200 during the surface treatment 370. The mounting platform 345 may hold one or more of the wafers 100 and 200 using a combination of clamps, vacuum pressure, and/or electrostatic forces, and may also include heating and cooling mechanisms in order to control the temperature of the wafers 100 and 200 during the processes.

Additionally, in embodiments in which the surface treatment 370 is a plasma activation treatment, the mounting platform 345 may further comprise a lower electrode 319 coupled to a first RF generator 321. The lower electrode 319 may be electrically biased by the first RF generator 321 (which may be connected to and under control of the controller 380) at a RF voltage during the surface treatment 370. By being electrically biased, the lower electrode 319 is used to provide a bias to the incoming treatment gases and assist to ignite them into a treatment plasma. Additionally, the lower electrode 319 is also utilized to maintain the plasma during the surface treatment 370.

Furthermore, while a single mounting platform 345 is illustrated in FIG. 2A, this is merely intended for clarity and is not intended to be limiting. Rather, any number of mounting platforms 345 may additionally be included within the surface treatment station 314. As such, multiple semiconductor substrates may be treated simultaneously.

Additionally, the surface treatment station 314 comprises a showerhead 329. The showerhead 329 receives the treatment plasma and helps to disperse the treatment plasma into the surface treatment station 314. In some embodiments, the showerhead 329 is designed to evenly disperse the treatment gases in order to minimize undesired process conditions that may arise from uneven dispersal and has a circular design with openings dispersed evenly around the showerhead 329 to allow for the even dispersal of the treatment plasma into the surface treatment station 314. However, any suitable number and distribution of openings can be used.

The surface treatment station 314 also comprises an upper electrode 327, for use as a plasma generator. In an embodiment the plasma generator may be a transformer coupled plasma generator and may be, e.g., a coil. The coil may be attached to a second RF generator 323 that is utilized to provide power to the upper electrode 327 (which may be connected to and under control of the controller 380) in order to ignite the plasma during introduction of the treatment gases.

However, while the upper electrode 327 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may be utilized. All such methods are fully intended to be included within the scope of the embodiments.

In the surface treatment 370, the exposed surfaces of the wafers 100 and 200 are activated. For example, in an embodiment, the bonding area may initially be purged with an inert gas ambient such as e.g. Ar, $N_2$, the like, or a combination thereof. Once purged a process gas used for generating the plasma may be nitrogen ($N_2$), oxygen ($O_2$), or an $N_2/O_2$ mixture and may be introduced into the surface treatment station 314 through the showerhead 329. However, any suitable process gas may be used to generate the plasma.

Figure 2B:
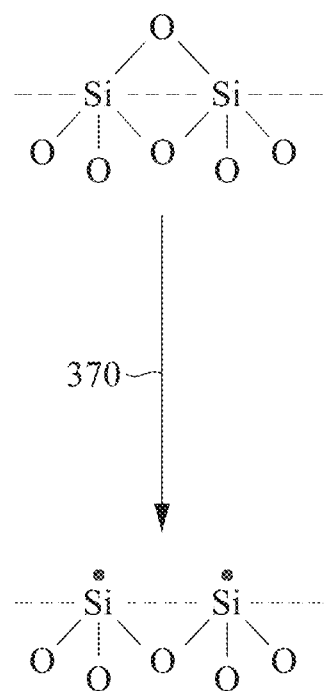
FIG. 2B illustrates a chemical reaction of an intermediate step in a bonding process, in accordance with some embodiments.

FIG. 2B illustrates the effect of the surface treatment 370 on the surfaces of the wafers 100 and 200, in accordance with some embodiments in which the wafers 100 and 200 are silicon wafers to be subsequently bonded by oxide-oxide bonding. The surface treatment 370 acts to remove oxygen atoms from silicon atoms on top surfaces of a silicon oxide layer on the wafers 100 and 200. This activates the surfaces of the wafers 100 and 200 in preparation for subsequent oxide-oxide bonding.

Figure 3A:
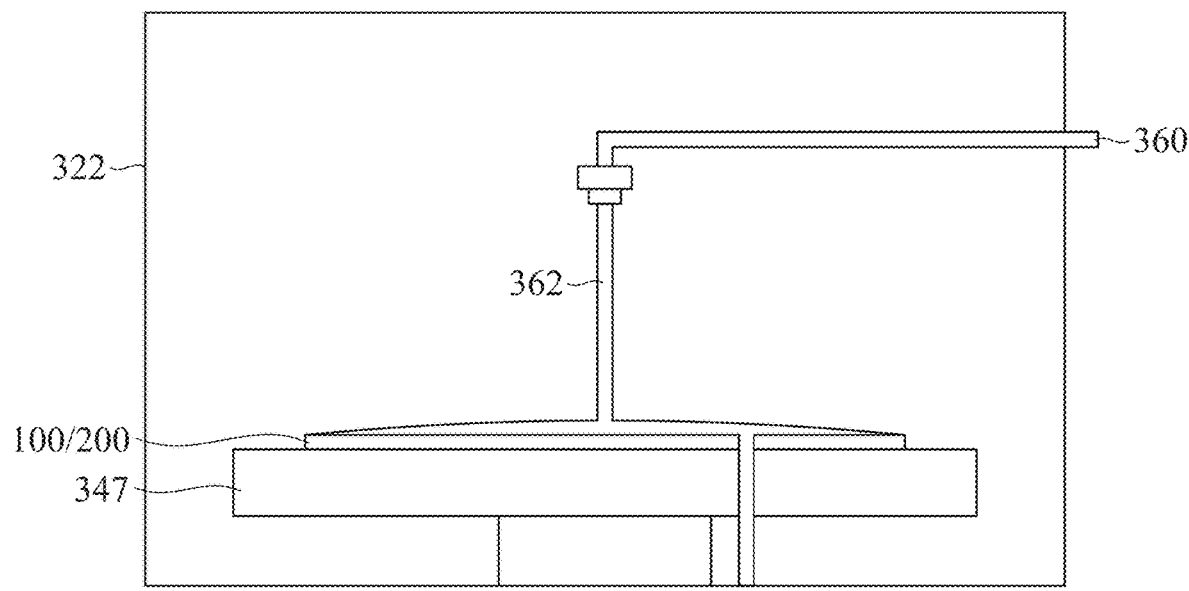
FIG. 3A illustrates a cross-sectional view of an intermediate step in a bonding process, in accordance with some embodiments.

Referring to FIG. 1 and FIG. 3A (with FIG. 3A illustrating a view of the cleaning station 322 in FIG. 1), once the surface treatment 370 has been performed, a transfer robot 306 transfers the wafers 100 and 200 to the cleaning station 322. The cleaning station 322 may be used to perform a cleaning step on the wafers 100 and 200 to remove metal oxides, chemicals, particles, and other undesirable substances from the surfaces of the wafers 100 and 200 prior to bonding.

In an embodiment the cleaning station 322 comprises a mounting station 347 and a faucet 360. The mounting station 347 may be similar to the mounting platform 345 described above with respect to FIG. 2. For example, the mounting station 347 may hold one or more of the wafers 100 and 200 using a combination of clamps, vacuum pressure, and/or electrostatic forces, and may also include heating and cooling mechanisms. However, any suitable devices for holding the wafers 100 and 200 may be utilized.

The faucet 360 is positioned over the mounting station 347 in order to dispense one or more cleaning agents over wafers 100 and 200 when the wafers 100 and 200 are mounted in the mounting station 347. During the cleaning step, the wafers 100 and 200 are mounted in the mounting station 347 and a cleaning agent 362 is then dispensed from the faucet 360 over the wafers 100 and 200. In some embodiments, the cleaning agent 362 is deionized (DI) water. In other embodiments the cleaning agent 362 comprises, in addition to DI water, a chemical such as $NH_3$, $H_2O_2$, citric acid, or the like. However, any suitable cleaning agent 362 may be utilized.

Figure 3B:
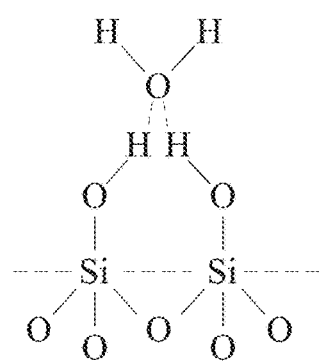
FIG. 3B illustrates a chemical reaction of an intermediate step in a bonding process, in accordance with some embodiments.

FIG. 3B illustrates the effect of the cleaning agent 362 on the surfaces of the wafers 100 and 200, in accordance with some embodiments in which the wafers 100 and 200 are silicon wafers to be subsequently bonded by oxide-oxide bonding and the cleaning agent 362 comprises water. Silanol groups form on the activated surface of the wafers 100 and 200 and water molecules attach to the silanol groups, which is advantageous for subsequent oxide-oxide bonding between the wafers 100 and 200.

Figure 4A:
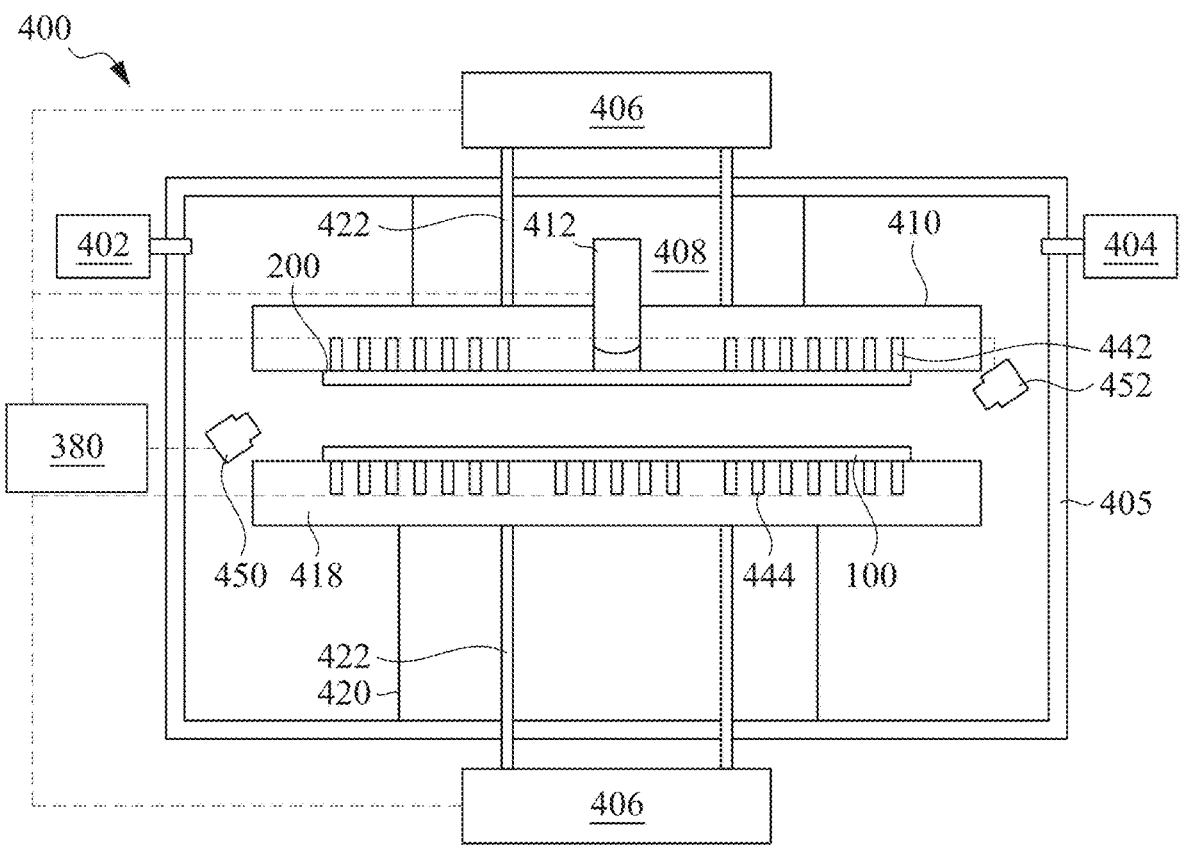
FIG. 4A illustrates a cross-sectional view of an intermediate step in a bonding process, in accordance with some embodiments.
Figure 4B:
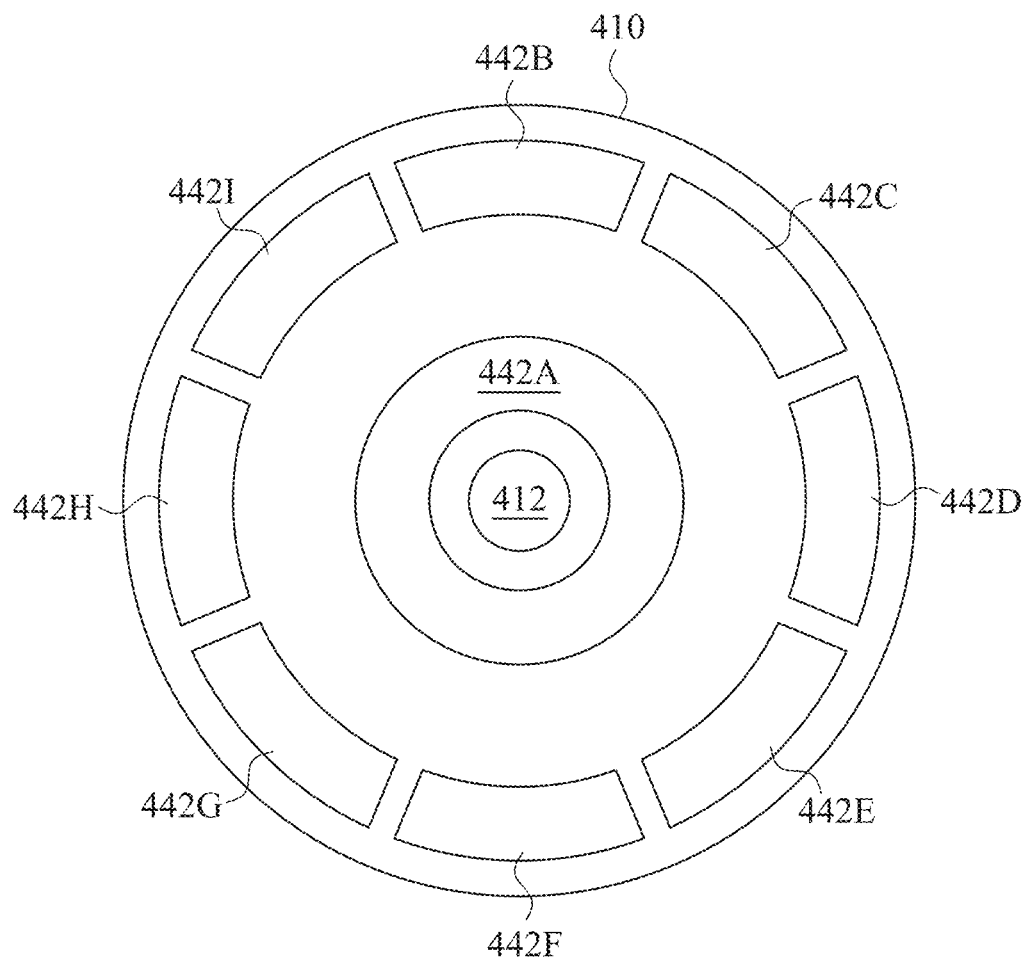
FIG. 4B illustrates a bottom view of a wafer chuck in a bonding system, in accordance with some embodiments.

Next, referring to FIG. 1 and FIGS. 4A-4B (with FIG. 4A illustrating a close-up view of the bonding station 400 in FIG. 1 and FIG. 4B illustrating a bottom view of top wafer chuck 410), a transfer robot 306 within the bonding area 320 transfers the wafers 100 and 200 from the cleaning station 322 to the bonding station 400. The bonding station 400 comprises a chamber 405, one or more gas outlet(s) 404, and one or more gas inlet(s) 402. An ambient pressure inside the chamber 405 can be controlled by flowing gas/air into the chamber 405 through the gas inlet(s) 402 and removing gas/air from the chamber 405 via the gas outlet(s) 404 through the use of one or more vacuum pumps connected to the gas outlet(s) 404. The bonding station 400 comprises a top wafer chuck 410 and a bottom wafer chuck 418 that can be positioned to face each other. The top wafer chuck 410 and the bottom wafer chuck 418 are moveable relative to each other in order to move wafers mounted on the top wafer chuck 410 and the bottom wafer chuck 418 together for bonding. In some embodiments, the top wafer chuck 410 and the bottom wafer chuck 418 are used to bond two semiconductor wafers (e.g., the wafer 100 to the wafer 200)

or two package components together. The top wafer chuck 410 is attached to a top arm 408, and the bottom wafer chuck 418 is attached to a bottom arm 420.

The top wafer chuck 410 and the bottom wafer chuck 418 are used in order to hold and control the orientation and movement of the wafers 100 and 200 during the bonding process. In some embodiments, the top wafer chuck 410 and the bottom wafer chuck 418 comprise any suitable material that may be used to hold one of the wafers 100 and 200. For example, silicon based materials, such as glass, silicon oxide, silicon nitride, or other materials, such as aluminum oxide, combinations of any of these materials, or the like may be used. Additionally, the top wafer chuck 410 and the bottom wafer chuck 418 have diameters that are suitable to hold one of the wafers 100 and 200. As such, while the size of the top wafer chuck 410 and the bottom wafer chuck 418 will be in some ways dependent upon the size of the wafers 100 and 200, the top wafer chuck 410 and the bottom wafer chuck 418 can have diameters in a range of 250 mm to 300 mm. However, any suitable dimensions may be utilized.

Furthermore, the bonding station 400 comprises one or more push pins 412. In some embodiments, the one or more push pins 412 are positioned to extend through top wafer chuck 410. The one or more push pins 412 are subsequently used to warp or bend one or more of the wafers 100 and 200 (see below, FIG. 5A). By warping the wafers 100 and 200, physical contact is initially made at a center of the wafers 100 and 200 before allowing the wafers 100 and 200 to bond at the edges.

The bottom surface of the top wafer chuck 410 has a plurality of vacuum zones 442 that are connected to one or more vacuum pumps 406 through a series of pipes 422. Each vacuum zone 442 is connected to a respective pipe 422 (not individually illustrated). FIG. 4B illustrates a bottom view of the top wafer chuck 410, in accordance with some embodiments. An inner vacuum zone 442 surrounds the push pin 412 at the center of the top wafer chuck 410. Segmented outer vacuum zones are distributed around the circumference of the top wafer chuck 410. In some embodiments, the top wafer chuck 410 includes eight segmented outer vacuum zones 442B, 442C, 442D, 442E, 442F, 442G, 442H, and 442I. However, any suitable arrangement of vacuum zones may be used. The vacuum pressures of the inner vacuum zone 442A and the outer vacuum zones 442B-442I are each individually controllable by the controller 380 to adjust for any warpages of the wafer 100.

The top surface of the bottom wafer chuck 418 has a plurality of vacuum zones 444 that are connected to one or more vacuum pumps 406 through respective pipes 422. In some embodiments, the vacuum zones 444 are arranged on the bottom wafer chuck 418 in a similar pattern as the vacuum zones 442 on the top wafer chuck 410, as illustrated in FIG. 4B. The vacuum pressures of the vacuum zones 444 are each controlled individually by the controller 380 to adjust for any warpages of the wafer 100.

During operation, the vacuum pump 406 will evacuate any gases from the vacuum zones 442 and 444 across the bottom surface of the top wafer chuck 410 and across the top surface of the bottom wafer chuck 418, respectively, thereby lowering the pressure (also referred to as the chuck pressure) within these vacuum zones 442 and 444. When the wafer 200 is placed against the bottom surface of the top wafer chuck 410 and the chuck pressure within the vacuum zones 442 at the bottom surface of the top wafer chuck 410 has been reduced by the vacuum pump 406, the pressure difference (e.g., the difference between the pressure in the chamber 405 and the chuck pressure) between the side of the wafer 200 facing the vacuum zones 442 at the bottom surface of the top wafer chuck 410 and the side of the wafer 200 facing away from the vacuum zones 442 at the bottom surface of the top wafer chuck 410 will hold the wafer 200 against the bottom surface of the top wafer chuck 410.

Likewise, when the wafer 100 is placed against the top surface of the bottom wafer chuck 418 and the chuck pressure within the vacuum zones 444 at the top surface of the bottom wafer chuck 418 has been reduced by the vacuum pump 406, the pressure difference (e.g., the difference between the pressure in the chamber 405 and the chuck pressure) between the side of the wafer 100 facing the vacuum zones 444 at the top surface of the bottom wafer chuck 418 and the side of the wafer 100 facing away from the vacuum zones 444 at the top surface of the bottom wafer chuck 418 will hold the wafer 100 against the top surface of the bottom wafer chuck 418. In some embodiments, the bottom surface profile of the wafer 100 is flattened against the bottom wafer chuck 418 to a height less than 200 nm.

At the bonding station 400, the wafers 100 and 200 are mounted on the top wafer chuck 410 and the bottom wafer chuck 418. Once in place the top wafer chuck 410 and the bottom wafer chuck 418 may align the wafers 100 and 200 for bonding. In a particular embodiment the bonding station 400 may align the wafers 100 and 200 to an alignment accuracy in a range of 10 nm to 100 µm. However, any suitable alignment may be performed.

A top-looking optical surface profiler 450 is configured to measure the surface profile of the wafer 200 mounted on the top wafer chuck 410, and a bottom-looking optical surface profiler 452 is configured to measure the surface profile of the wafer 100 mounted on the bottom wafer chuck 418. In some embodiments, the top-looking optical surface profiler 450 and the bottom-looking optical surface profiler 452 are located adjacent to the top wafer chuck 410 and the bottom wafer chuck 418. However, the top-looking optical surface profiler 450 and the bottom-looking optical surface profiler 452 may be located in any suitable locations that allow the top-looking optical surface profiler 450 to profile the wafer 200 mounted on the top wafer chuck 410 and the bottom-looking optical surface profiler 452 to profile the wafer 100 mounted on the bottom wafer chuck 418, respectively. The measurements of the surface profiles of the wafers 100 and/or 200 are subsequently used by the controller 380 to adjust the vacuum pressures of the vacuum zones 442 and 444 to control the surface profiles of the wafers 100 and/or 200 prior to initiating the bonding process (see below, FIGS. 5A-5D). In some embodiments, the optical surface profilers 450 and 452 are laser displacement sensors or interferometers. However, any suitable optical surface profilers may be used.

Figure 5A:
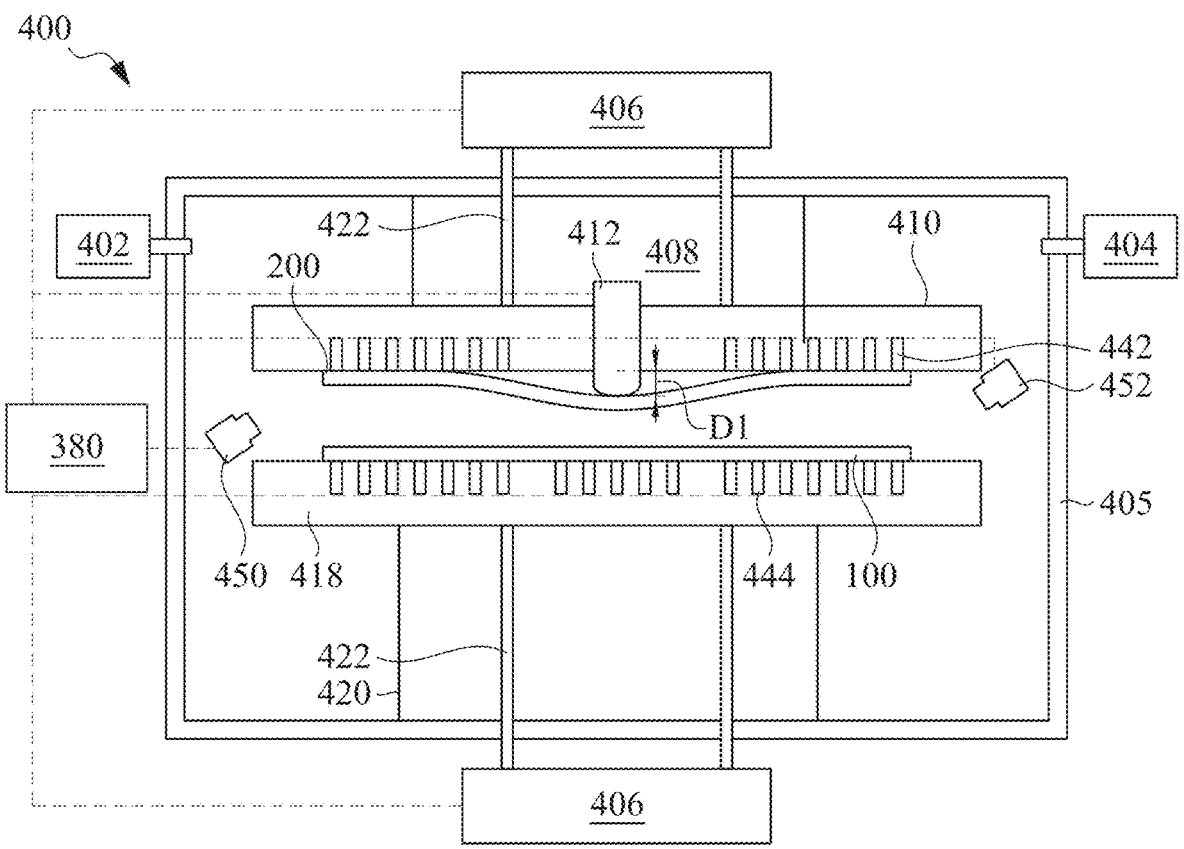
FIG. 5A illustrates a cross-sectional view of an intermediate step in a bonding process, in accordance with some embodiments.

In FIG. 5A, one or more of the push pins 412 are utilized to warp or deform the wafer 200 in preparation for the bonding process. The inner vacuum zone 442A (see above, FIG. 4B) is vented to release the center portion of the wafer 200 and the push pin(s) 412 is extended through the top wafer chuck 410 to deform the wafer 200. In some embodiments, the push pin(s) 412 is extended to a distance D1 below the bottom surface of the top wafer chuck 410 in a range of 10 µm to 100 µm, equal to the desired gap for the subsequent bonding of the wafers 100 and 200.

Figure 5B:
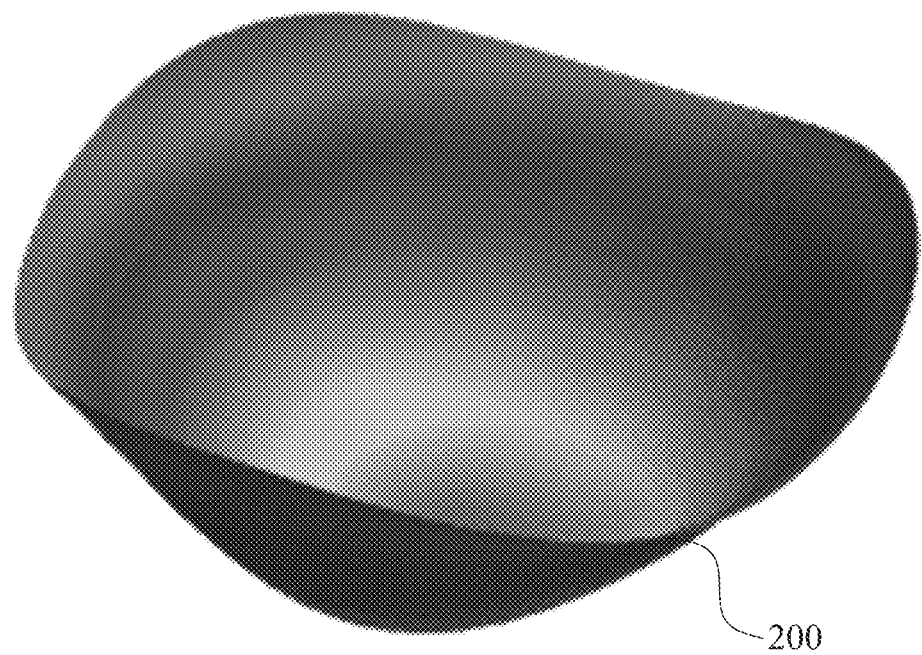
FIG. 5B illustrates a three-dimensional profile view of a wafer during an intermediate step in a bonding process, in accordance with some embodiments.

FIG. 5B illustrates the surface profile of the wafer 200 after being deformed by the push pin(s) 412, in accordance with some embodiments. The surface profile of the wafer 200 may be distorted around the outer edges of the wafer 200, which can lead to different local bonding wave velocities across the wafers 100 and 200 during a subsequent bonding process (see below, FIGS. 6A-9B) and local distortion of the bonded wafer pairs after the subsequent bonding process. The uneven distortion of the wafer 200 may be due to gravitational sag, bow and/or warp of the wafer 200, or uneven vacuum pressure of the vacuum zones 442B-442I. The wafer 100 may also have a distorted surface profile. In order to compensate for the distorted surface profile of the wafer 200 and/or 100, the optical surface profilers 450 and/or 452 are used to measure the respective surface profiles of the wafers 200 and/or 100 and adjust the vacuum pressures of the vacuum zones 442 and/or 444 to achieve more even surface profiles prior to initiating bonding.

Figure 5C:
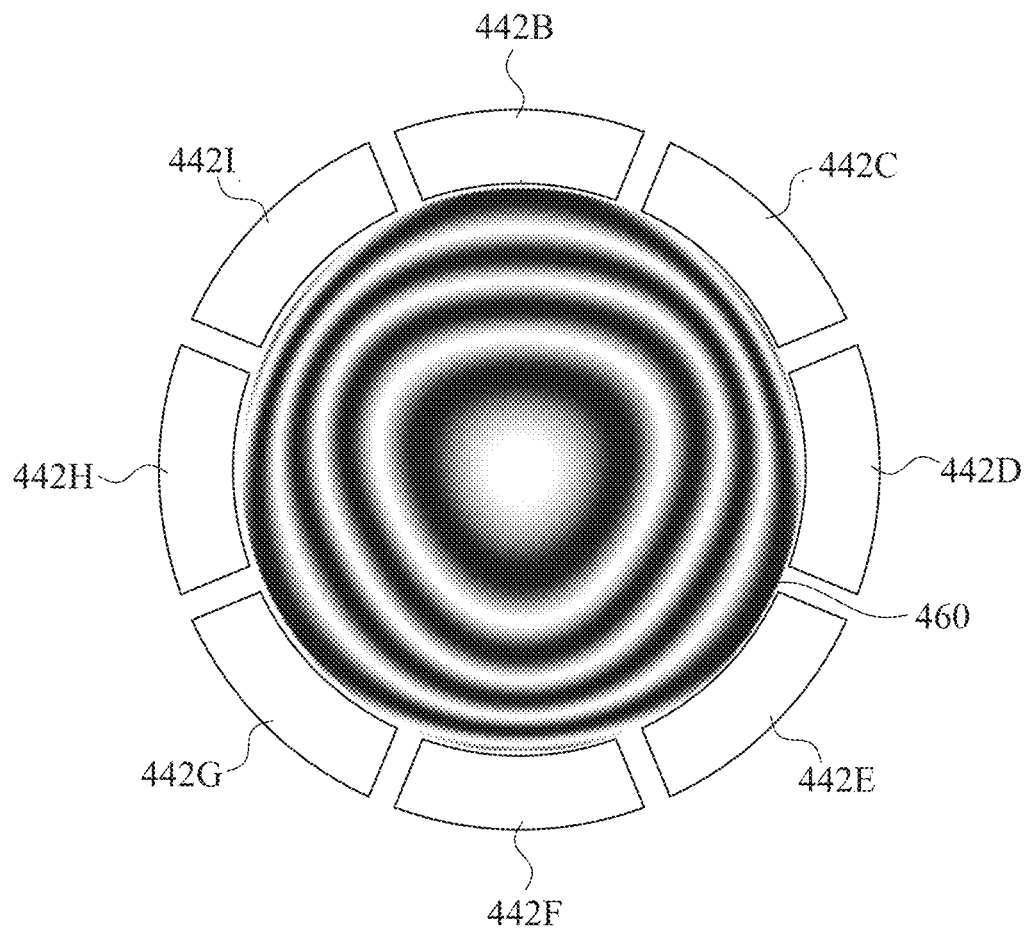
FIG. 5C illustrates a bottom view of a wafer chuck in a bonding system with a superimposed interference fringe pattern of a wafer, in accordance with some embodiments.

FIG. 5C illustrates an interference fringe pattern 460 superimposed over the bottom view of the top wafer chuck 410 showing the outer vacuum zones 442 around the interference fringe pattern 460, in accordance with some embodiments where the optical surface profiler 450 is an interferometer. The interference fringe pattern 460 is produced by the optical surface profiler 450 using projection of light, as illustrated above in FIG. 5B. The interference fringe pattern 460 indicates warpage of the surface profile of the wafer 200. For example, thin light and dark bands indicate areas of the wafer 200 having higher curvature, and thick light and dark bands indicate areas of the wafer 200 having lower curvature. An interference fringe pattern 460 with areas of thin and thick light and dark bands may indicate distortion of the outer edges of the wafer 200 by uneven curvature. Although FIG. 5C illustrates the interference fringe pattern 460 produced by an interferometer, other kinds of optical surface profilers may be used to measure the surface profile distortion. In some embodiments, the optical surface profiler 450 is a laser displacement sensor and produces measurements of the distortion of the surface profile of the wafer 200 with a laser scanning process. In some embodiments, the optical surface profiler 452 performs similar measurements of the surface profile distortion of the wafer 100. The measurements of the surface profile distortion by the optical surface profilers 450 and 452 are subsequently used to adjust the vacuum pressures of the vacuum zones 442 and/or 444.

Figure 5D:
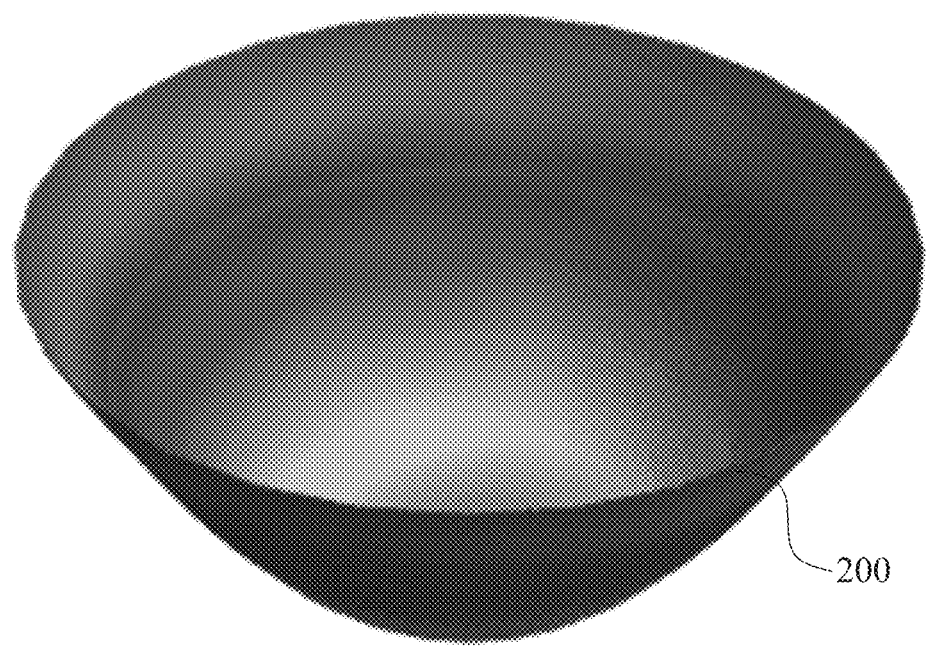
FIG. 5D illustrates a three-dimensional profile view of a wafer during an intermediate step in a bonding process, in accordance with some embodiments.
Figure 5E:
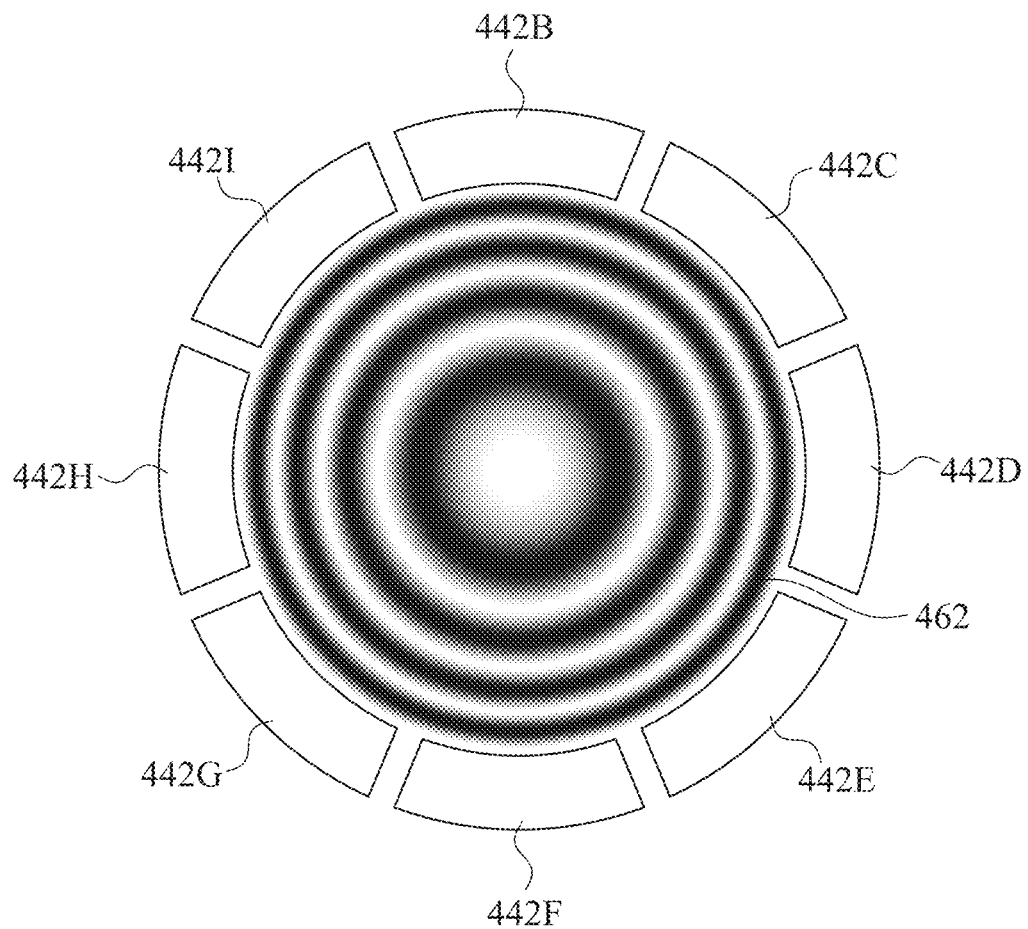
FIG. 5E illustrates a bottom view of a wafer chuck in a bonding system with a superimposed interference fringe pattern of a wafer, in accordance with some embodiments.

FIG. 5D illustrates the surface profile of the wafer 200 after the surface profile is tuned, and FIG. 5E illustrates an interference fringe pattern 462 with reduced surface profile distortion superimposed over the bottom view of the top wafer chuck 410 showing the outer vacuum zones 442. Different outer vacuum zones 442B-442I are set to different respective vacuum pressures in order to compensate for the measured surface profile distortion, e.g. the interference fringe pattern 462. For example, using the measurements of the surface profile distortion by the optical surface profiler 450 (see above, FIG. 5C), the controller 380 may instruct outer vacuum zones 442B, 442E, and 442G to increase their respective vacuum pressures to greater than the respective vacuum pressures of the outer vacuum zones 442C, 442D, 442F, 442H, and 442I. This adjustment of the vacuum pressures changes the forces applied to outer portions of the wafer 200 and reduces the distortion of the surface profile of the wafer 200. The reduced distortion is measured by the optical surface profiler 450, as shown by the interference fringe pattern 462. As illustrated in FIGS. 5B and 5D in accordance with some embodiments, adjusting the respective vacuum pressures of the outer vacuum zones 442B-442I may increase the circular symmetry of the interference fringe pattern 462 relative to the symmetry of the interference fringe pattern 460. For example, the even thickness of the light and dark bands of the interference fringe pattern 462 indicates more even curvature of the wafer 200 and reduced distortion of the outer edges of the wafer 200. In some embodiments, feedback from the optical surface profiler 450 is used to control the respective vacuum pressures of the outer vacuum zones 442B-442I until the surface distortion is decreased to below a desired threshold and the surface profile of the wafer 200 becomes a concentric dome shape, as illustrated in accordance with FIG. 5D. However, any suitable customized shape of the surface profile of the wafer 200 may be formed by adjusting the respective vacuum pressures of the outer vacuum zones 442B-442I. In some embodiments, the adjusted vacuum pressures of the outer vacuum zones 442B-442I are different from each other. For example, the adjusted vacuum pressure of the outer vacuum zone 442E is greater than the adjusted vacuum pressure of the outer vacuum zone 442B.

In some embodiments, feedback from the optical surface profiler 452 is used to adjust the respective vacuum pressures of the vacuum zones 444 (see above, FIG. 5A) and achieve reduced distortion of the surface profile of the wafer 100 by a similar method as described above for the wafer 200. In some embodiments, the surface profiles of the wafers 100 and 200 are flattened around their respective perimeters in order to set up parallelism between their respective surfaces for the subsequent bonding process, which may decrease distortion of the bonded wafer pair after bonding.

Figure 6A:
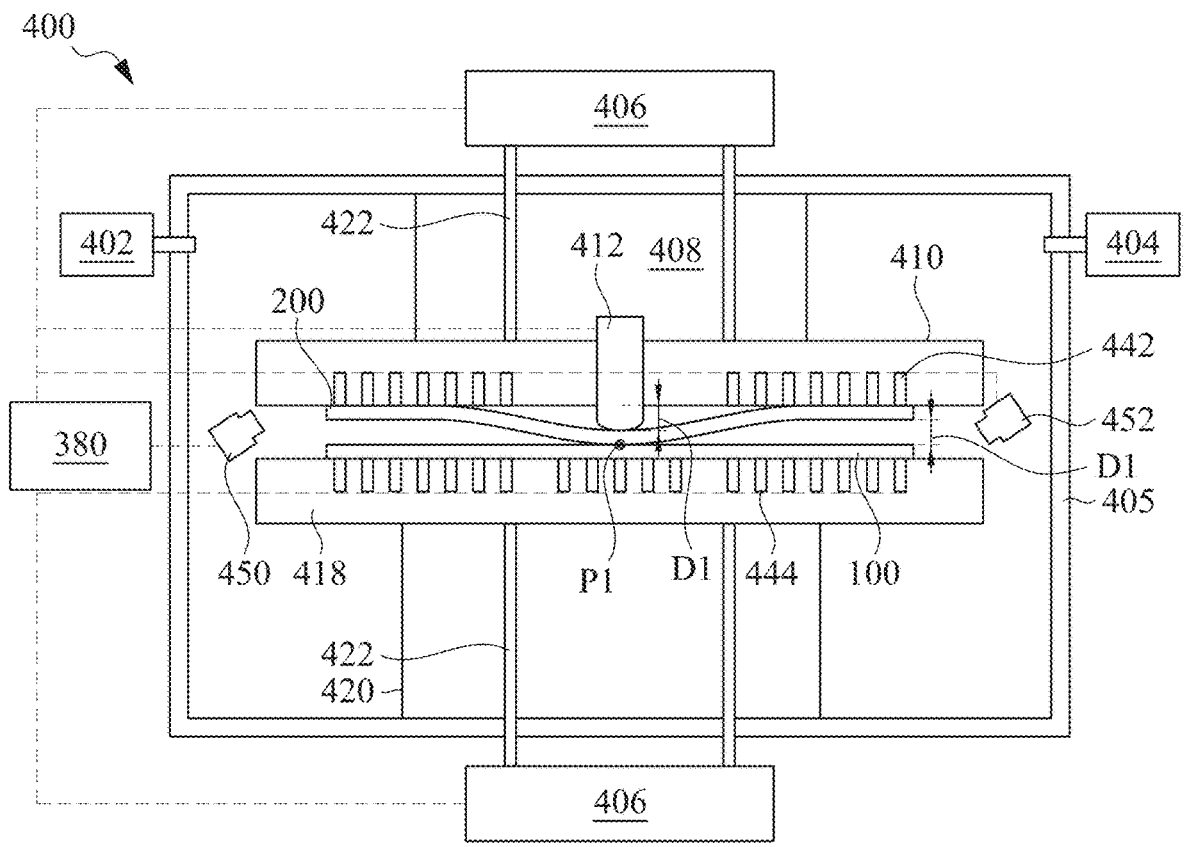
FIG. 6A illustrates a cross-sectional view of an intermediate step in a bonding process, in accordance with some embodiments.

FIG. 6A illustrates the initiation of a bonding process of the wafers 100 and 200. In some embodiments, the bonding process is performed by bringing the wafers 100 and 200 into contact by utilizing a combination of the top wafer chuck 410, the bottom wafer chuck 418, and the push pin 412 to apply pressure against the wafers 100 and 200 at a first point P1. For example, the top wafer chuck 410 and the bottom wafer chuck 418 may be brought together so that respective outer edges of the wafers 100 and 200 are separated by a desired bonding gap with a distance in a range of 10 μm to 100 μm, bringing the wafer 200 into contact with the wafer 100 at the first point P1 below the push pin 412. The bonding then proceeds in a wave (also referred to as a bonding wave) from the first point P1 and moving outwards towards the edges of the wafers 100 and 200.

Figure 6B:
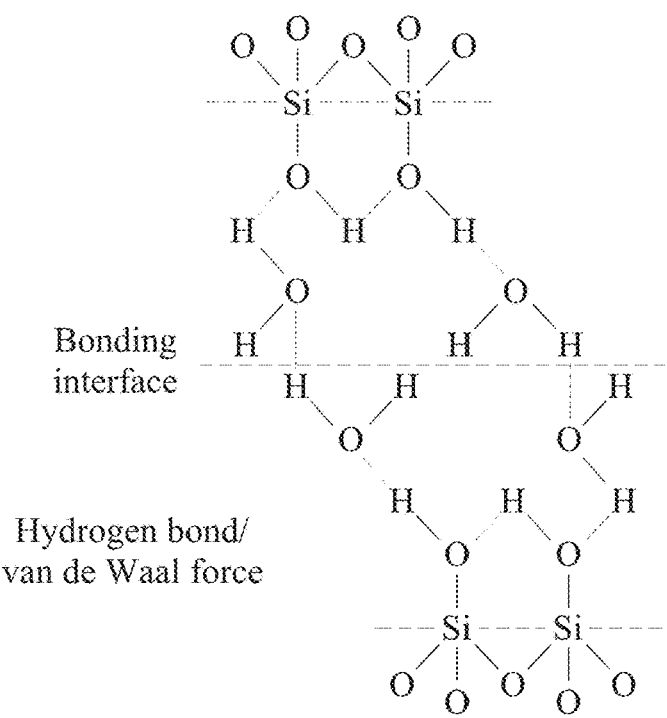
FIG. 6B illustrates a chemical reaction of an intermediate step in a bonding process, in accordance with some embodiments.

FIG. 6B illustrates a formation of bonds between the wafers 100 and 200 across the bonding interface between the wafers 100 and 200, in accordance with some embodiments in which the bonding process includes oxide-oxide bonding. As the bonding wave proceeds outwards from the first point P1, hydrogen bonds between hydrogen and oxygen atoms of water molecules attached to silanol groups on the surfaces of the wafers 100 and 200 may be formed, such as through Van der Waals forces.

Figure 7:
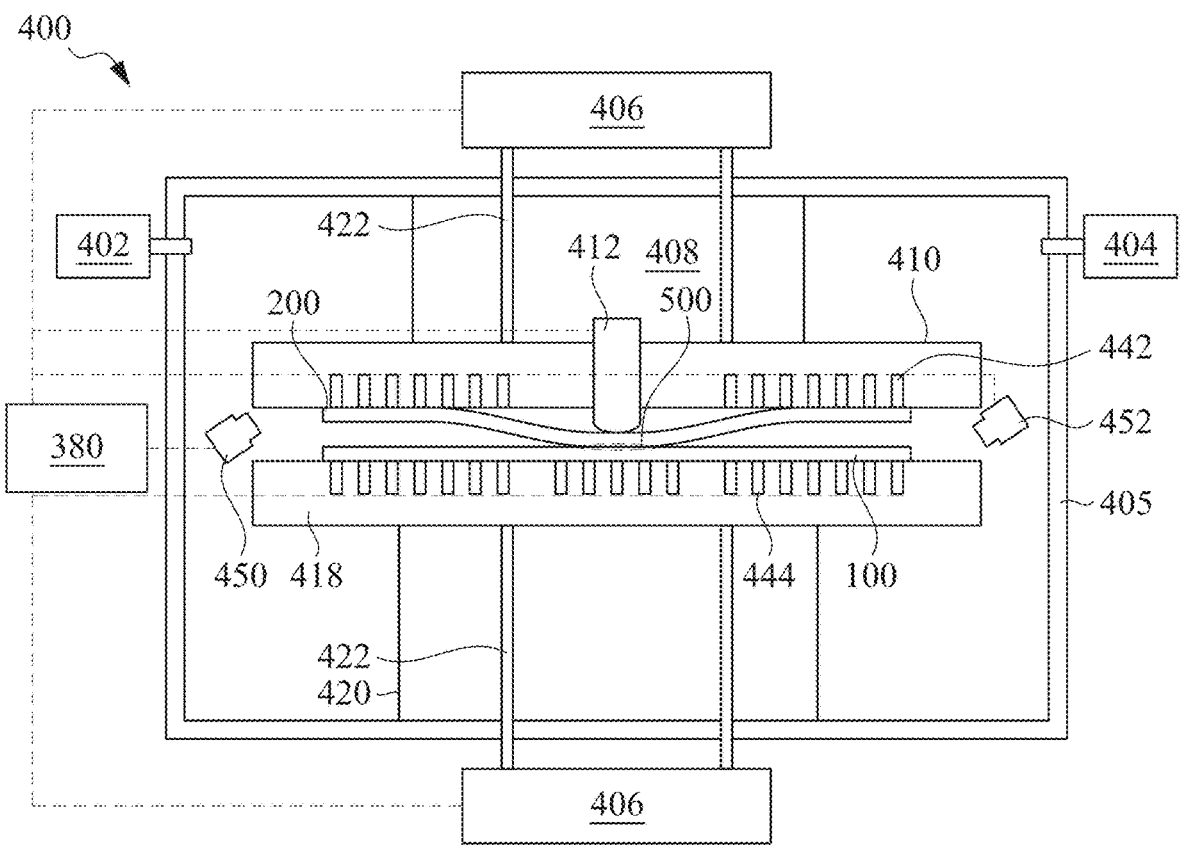
FIG. 7 illustrates a cross-sectional view of an intermediate step in a bonding process, in accordance with some embodiments.

FIG. 7 illustrates a bonding wave 500 propagating outwards from the first point P1 between the wafers 100 and 200. The local bonding wave velocities of the bonding wave 500 may have increased uniformity by parallelism being set up between the outer edges of the wafers 100 and 200 by the surface profiles of the wafers 100 and 200 being flattened around their respective perimeters (see above, FIG. 5E), which may decrease distortion of the bonded wafer pair after bonding.

Figure 8:
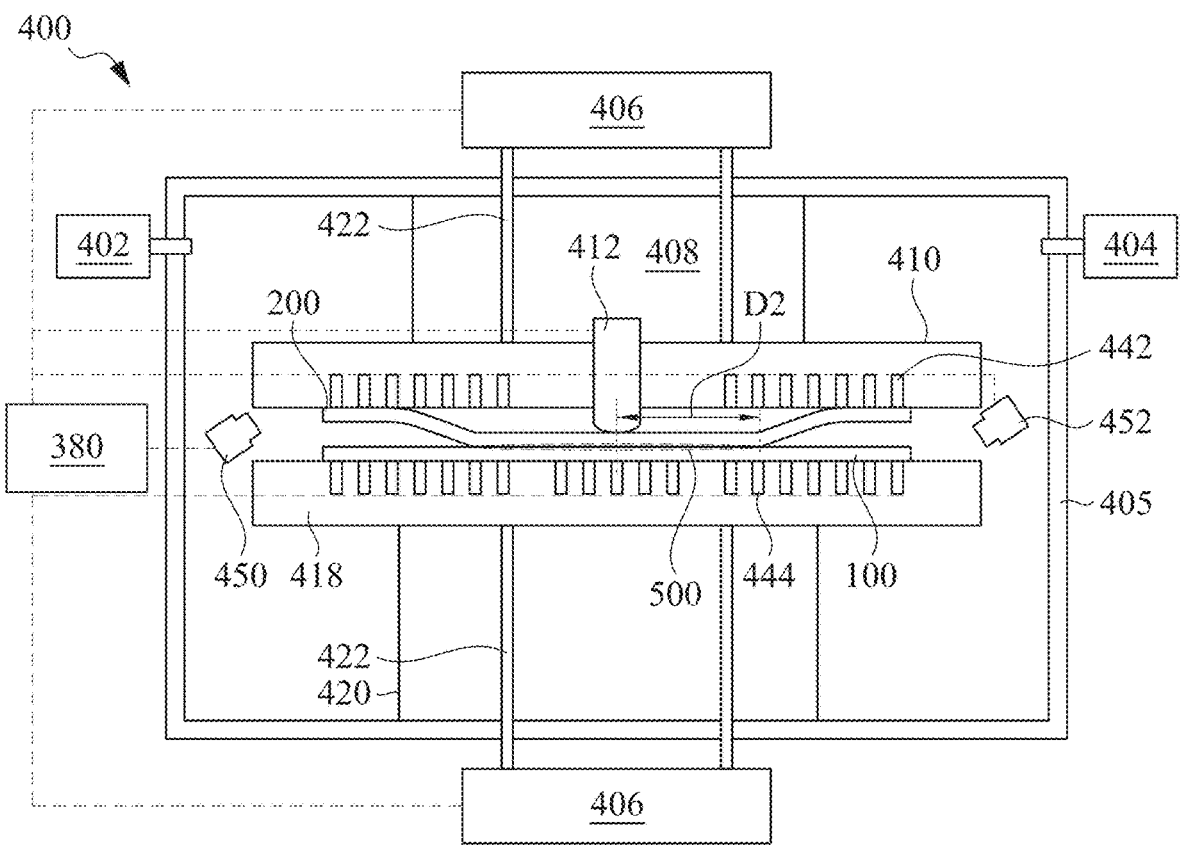
FIG. 8 illustrates a cross-sectional view of an intermediate step in a bonding process, in accordance with some embodiments.

FIG. 8 illustrates the bonding wave 500 between the wafers 100 and 200 reaching a distance D2 from the point P1, in accordance with some embodiments. Once the bonding wave 500 reaches a distance D2 in a range of 50 mm to 120 mm, depending on film properties and patterning scheme, the vacuum zones 442 on the top wafer chuck 410 are deactivated. This releases the wafer 200 from the top wafer chuck 410 and allows the bonding wave 500 to propagate to the edges of the wafers 100 and 200.

Figure 9A:
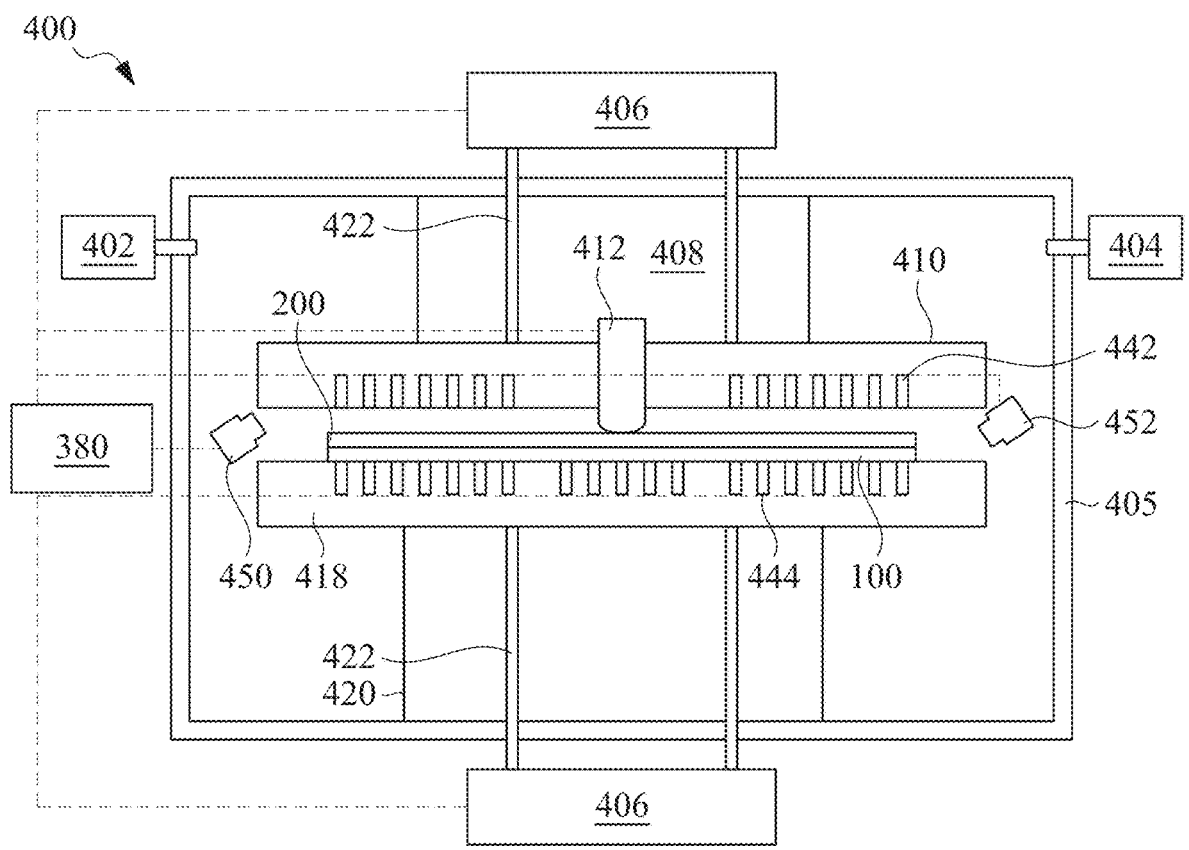
FIG. 9A illustrates a cross-sectional view of an intermediate step in a bonding process, in accordance with some embodiments.
Figure 9B:
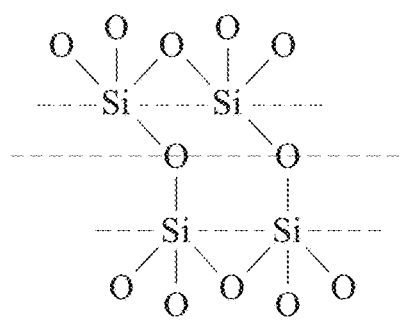
FIG. 9B illustrates a chemical reaction of an intermediate step in a bonding process, in accordance with some embodiments.

FIG. 9A illustrates the wafers 100 and 200 after the bonding wave 500 has propagated to the edges of the wafers 100 and 200. Subsequently, in some embodiments an anneal is performed to form permanent adhesion (e.g., fusion bond) the wafers 100 and 200 together by forming chemical bonds between the oxide surfaces. For example, FIG. 9B illustrates the atoms (such as oxygen atoms) on the interface of the wafers 100 and 200 forming chemical or covalence bonds (such as Si—O—Si bonds) with the atoms (such as silicon atoms) in the wafers 100 and 200. Slight variations in surfaces of the bonding structures can be overcome through the annealing process while pressure keeps the structures together. In some embodiments a bond strength of about 0.5 to 10 $J/m^2$ can be exerted to hold the wafers 100 and 200 together.

After the bonding process is completed, the one or more push pins 412 is retracted and the top wafer chuck 410 and bottom wafer chuck 418 are separated. The bonded wafers 100 and 200 are then removed from the bottom wafer chuck 418, such as by a transfer robot 306. The bonded wafers 100 and 200 may then be transferred back to the loading stations 202 or 204 by the transfer robot 306, where the bonded wafers 100 and 200 are unloaded from the wafer bonding system 300.

Figure 10:
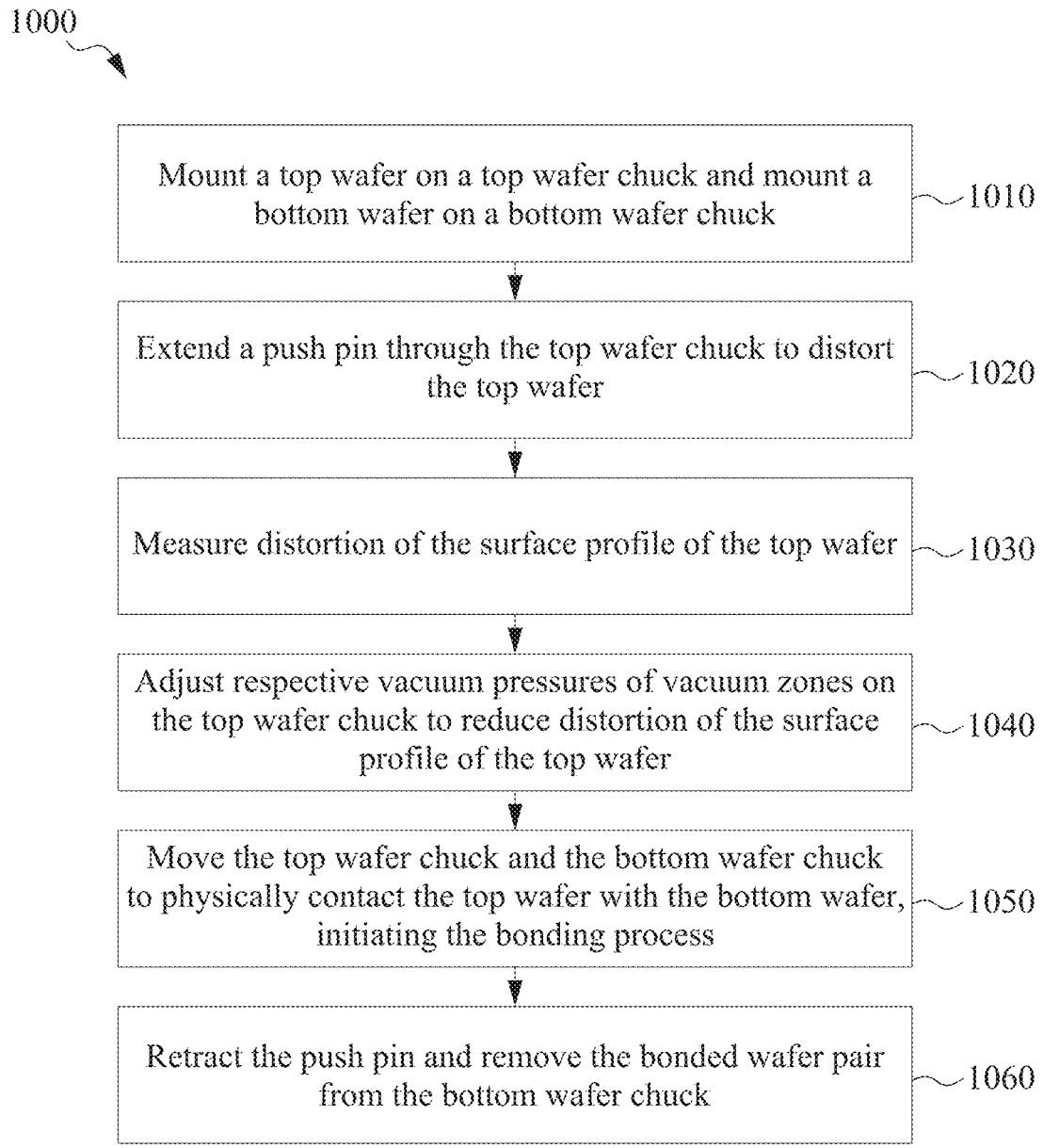
FIG. 10 illustrates a flow chart of a method of a bonding process, in accordance with some embodiments.

FIG. 10 illustrates a method 1000 of bonding two wafers 100 and 200 as illustrated in FIGS. 1 through 9B. In step 1010, a wafer 200 is mounted on a top wafer chuck 410 and a wafer 100 is mounted on a bottom wafer chuck 418, as described above with respect to FIG. 4A. In step 1020, a push pin 412 is extended through the top wafer chuck to distort the wafer 200, as described above with respect to FIGS. 5A-5B. In step 1030, the distortion of the surface profile of the wafer 200 is measured by the optical surface profiler 450, as described above with respect to FIG. 5C. In step 1040, respective vacuum pressures of the outer vacuum zones 442B-442I are adjusted to reduce distortion of the surface profile of the wafer 200, as described above with respect to FIGS. 5D-5E. In step 1050, the top wafer chuck 410 and the bottom wafer chuck 418 are moved together to physically contact the wafers 100 and 200 and initiate the bonding process, as described above with respect to FIG. 6A. In step 1060, the push pin 412 is retracted and the bonded wafer pair of wafers 100 and 200 is removed from the bottom wafer chuck 418, as described above in respect to FIGS. 9A-9B.

Embodiments may achieve advantages. Local distortion of bonded wafer pairs can be decreased by utilizing a wafer bonding system with an optical surface profiler such as a laser displacement sensor or interferometer. The optical surface profiler measures surface profile distortion of a first wafer mounted on a chuck prior to a bonding process with a second wafer. Vacuum pressures of vacuum zones on the chuck are adjusted using the surface profile distortion measurements to compensate for the surface profile distortion. The first wafer is bonded with the second wafer after the surface profile distortion is reduced.

In accordance with an embodiment, a method of forming a semiconductor device includes: mounting a first wafer on a first wafer chuck and mounting a second wafer on a second wafer chuck; extending a push pin through the first wafer chuck to distort the first wafer; measuring a surface profile distortion of the first wafer with a first surface profiler; adjusting a first vacuum pressure of a first vacuum zone on the first wafer chuck using a measurement of the surface profile distortion; moving the first wafer chuck towards the second wafer chuck, wherein the first wafer physically contacts the second wafer; and bonding the first wafer to the second wafer. In an embodiment, the first surface profiler is an interferometer. In an embodiment, the measurement of the surface profile distortion is an interference fringe pattern. In an embodiment, adjusting the first vacuum pressure of the first vacuum zone increases a symmetry of the interference fringe pattern. In an embodiment, the first surface profiler is a laser displacement sensor. In an embodiment, a surface profile of the first wafer is a concentric dome shape after adjusting the first vacuum pressure of the first vacuum zone. In an embodiment, the method further includes adjusting a second vacuum pressure of a second vacuum zone on the first wafer chuck. In an embodiment, the adjusted second vacuum pressure is greater than the adjusted first vacuum pressure.

In accordance with another embodiment, a method of forming a semiconductor device includes: loading a first wafer into a wafer bonding system, the first wafer being mounted on a first wafer chuck with a first plurality of vacuum zones; measuring a first surface profile distortion of the first wafer on the first wafer chuck with a first surface profiler; adjusting a first vacuum pressure of a first vacuum zone of the first plurality of vacuum zones using a measurement of the first surface profile distortion; physically contacting the first wafer with a second wafer at a first point, wherein physically contacting the first wafer with the second wafer initiates a bonding wave; and after the first wafer and the second wafer are bonded, removing the first wafer and the second wafer from the wafer bonding system. In an embodiment, the method further includes mounting the second wafer on a second wafer chuck with a second plurality of vacuum zones. In an embodiment, physically contacting the first wafer with the second wafer includes moving the first wafer chuck towards the second wafer chuck. In an embodiment, the method further includes using a second surface profiler to measure a second surface profile distortion of the second wafer on the second wafer chuck. In an embodiment, the method further includes adjusting a second vacuum pressure of a second vacuum zone of the second plurality of vacuum zones using a measurement of the second surface profile distortion. In an embodiment, the method further includes distorting the first wafer with a push pin before measuring the first surface profile distortion.

In accordance with yet another embodiment, a wafer bonding system includes: a first wafer chuck in a chamber, the first wafer chuck having a first surface to support a first wafer, the first surface including a first plurality of vacuum zones, wherein respective vacuum pressures of each vacuum zone of the first plurality of vacuum zones are controlled by a controller; a second wafer chuck having a second surface to support a second wafer, the second surface being opposite the first surface, the second wafer chuck and the first wafer chuck being movable relative to each other; and a first surface profiler configured to measure a surface profile distortion of the first wafer, the first surface profiler providing measurements of the surface profile distortion to the controller. In an embodiment, the first surface profiler is a laser displacement sensor. In an embodiment, the first surface profiler is an interferometer. In an embodiment, the wafer bonding system further includes a second surface profiler configured to measure surface profile distortion of the second wafer. In an embodiment, the second surface of the second wafer chuck includes a second plurality of vacuum zones, respective vacuum pressures of each vacuum zone of the second plurality of vacuum zones being controlled by the controller. In an embodiment, the wafer bonding system further includes a push pin extendable through the first wafer chuck.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    mounting a first wafer on a first wafer chuck and mounting a second wafer on a second wafer chuck;
    extending a push pin through the first wafer chuck to distort the first wafer;
    measuring a surface profile distortion of the first wafer with a first surface profiler;
    adjusting a first vacuum pressure of a first vacuum zone on the first wafer chuck using a measurement of the surface profile distortion;
    moving the first wafer chuck towards the second wafer chuck, wherein the first wafer physically contacts the second wafer; and
    bonding the first wafer to the second wafer.

2. The method of claim 1, wherein the first surface profiler is an interferometer.

3. The method of claim 2, wherein the measurement of the surface profile distortion is an interference fringe pattern.

4. The method of claim 3, wherein adjusting the first vacuum pressure of the first vacuum zone increases a symmetry of the interference fringe pattern.

5. The method of claim 1, wherein the first surface profiler is a laser displacement sensor.

6. The method of claim 1, wherein a surface profile of the first wafer is a concentric dome shape after adjusting the first vacuum pressure of the first vacuum zone.

7. The method of claim 1, further comprising adjusting a second vacuum pressure of a second vacuum zone on the first wafer chuck.

8. The method of claim 7, wherein the adjusted second vacuum pressure is greater than the adjusted first vacuum pressure.

9. A method of forming a semiconductor device, the method comprising:
    loading a first wafer into a wafer bonding system, the first wafer being mounted on a first wafer chuck with a first plurality of vacuum zones;
    measuring a first surface profile distortion of the first wafer on the first wafer chuck with a first surface profiler;
    adjusting a first vacuum pressure of a first vacuum zone of the first plurality of vacuum zones using a measurement of the first surface profile distortion;
    physically contacting the first wafer with a second wafer at a first point, wherein physically contacting the first wafer with the second wafer initiates a bonding wave; and
    after the first wafer and the second wafer are bonded, removing the first wafer and the second wafer from the wafer bonding system.

10. The method of claim 9, further comprising mounting the second wafer on a second wafer chuck with a second plurality of vacuum zones.

11. The method of claim 10, wherein physically contacting the first wafer with the second wafer comprises moving the first wafer chuck towards the second wafer chuck.

12. The method of claim 10, further comprising using a second surface profiler to measure a second surface profile distortion of the second wafer on the second wafer chuck.

13. The method of claim 12, further comprising adjusting a second vacuum pressure of a second vacuum zone of the second plurality of vacuum zones using a measurement of the second surface profile distortion.

14. The method of claim 9, further comprising distorting the first wafer with a push pin before measuring the first surface profile distortion.

15. A method of forming a semiconductor device, the method comprising:
    mounting a first wafer on a first wafer chuck and mounting a second wafer on a second wafer chuck;
    distorting the first wafer;
    measuring a surface profile of the first wafer with a first surface profiler;
    adjusting a vacuum pressure of a first vacuum zone on the first wafer chuck using the surface profile of the first wafer;
    measuring a surface profile of the second wafer with a second surface profiler;
    adjusting a vacuum pressure of a first vacuum zone on the second wafer chuck using the surface profile of the second wafer;
    moving the first wafer chuck to bring the first wafer into contact with the second wafer; and
    bonding the first wafer and the second wafer.

16. The method of claim 15, wherein distorting the first wafer comprises extending a push pin through the first wafer chuck to push a central portion of the first wafer towards the second wafer.

17. The method of claim 15, wherein the adjusted vacuum pressure of the first vacuum zone on the first wafer chuck increases a symmetry of the surface profile of the first wafer.

18. The method of claim 15, further comprising adjusting a vacuum pressure of a second vacuum zone on the first wafer chuck using the surface profile of the first wafer, wherein the adjusted vacuum pressure of the second vacuum zone on the first wafer chuck is greater than the adjusted vacuum pressure of the first vacuum zone on the first wafer chuck.

19. The method of claim 15, wherein the first surface profiler is a laser displacement sensor or an interferometer.

20. The method of claim 15, wherein the second surface profiler is a laser displacement sensor or an interferometer.

* * * * *